(12) United States Patent
Alexander et al.

(10) Patent No.: US 7,509,560 B2
(45) Date of Patent: Mar. 24, 2009

(54) MECHANISM FOR ADJACENT-SYMBOL ERROR CORRECTION AND DETECTION

(75) Inventors: James W. Alexander, Hillsboro, OR (US); Thomas J. Holman, Portland, OR (US); Mark A. Heap, Sunnyvale, CA (US); Stanley S. Kulick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 660 days.

(21) Appl. No.: 10/747,590

(22) Filed: Dec. 29, 2003

(65) Prior Publication Data

US 2005/0154943 A1 Jul. 14, 2005

(51) Int. Cl.
*G11C 29/00* (2006.01)

(52) U.S. Cl. ...................................... 714/763
(58) Field of Classification Search .................. 714/763
See application file for complete search history.

(56) References Cited

U.S. PATENT DOCUMENTS

| | | | | |
|---|---|---|---|---|
| 5,996,096 | A * | 11/1999 | Dell et al. | 714/710 |
| 6,243,829 | B1 * | 6/2001 | Chan | 714/7 |
| 7,409,616 | B1 * | 8/2008 | Sardi et al. | 714/738 |
| 2001/0016920 | A1 * | 8/2001 | Chan | 714/11 |

OTHER PUBLICATIONS

Stojko et al. 'Error Correction Code,' IBM Tech. Bulletin V 10, No. 10, Mar. 1968.*

* cited by examiner

*Primary Examiner*—Guy J Lamarre
(74) *Attorney, Agent, or Firm*—Blakely, Sokoloff, Taylor & Zafman LLP

(57) ABSTRACT

According to one embodiment a computer system is disclosed. The computer system includes memory. The memory includes two or more rows, where each row has a plurality of memory devices. The computer system also includes a chipset. The chipset includes a detection/correction circuit to detect single and double symbol errors and correct single symbol errors for each memory row, and markers to maintain a log of errors within each memory row.

20 Claims, 6 Drawing Sheets

MECHANISM FOR ADJACENT-SYMBOL ERROR CORRECTION AND DETECTION

FIELD OF THE INVENTION

The present invention relates to computer systems; more particularly, the present invention relates to the error detection and correction of memory errors.

BACKGROUND

Error correcting codes (ECC) have been routinely used for fault tolerance in computer memory subsystems. The most commonly used codes are the single error correcting (SEC) and double error detecting (DED) codes capable of correcting all single errors and detecting all double errors in a code word.

As the trend of chip manufacturing is toward a larger chip capacity, more memory subsystems will be configured in b-bits-per-chip. The most appropriate symbol ECC to use on the memory are the single symbol error correcting (SbEC) and double symbol error detecting (DbED) codes, wherein "b" is the width (number of bits in output) of the memory device, that correct all single symbol errors and detect all double symbol errors in a code word.

A memory designed with an SbEC-DbED code can continue to function when a memory chip fails, regardless of its failure mode. When there are two failing chips that line up in the same ECC word sometime later, the SbEC-DbED code would provide the necessary error detection and protect the data integrity for the memory.

Existing and imminent memory systems utilize eighteen memory devices. However, the present SbEC-DbED error correcting codes utilize 36 memory devices in order to provide chip fail correction and detection. Thus, the cost increases due to the added expense of 36 memory devices for error correcting purposes and they are inflexible because they do not scale (adapt) to the memory systems with eighteen memory devices. Furthermore, the various circuits for encoding and decoding the errors are complex. Thus, increasing the cost and design of computer systems to insure data integrity.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A mechanism for adjacent-symbol error correction and detection is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
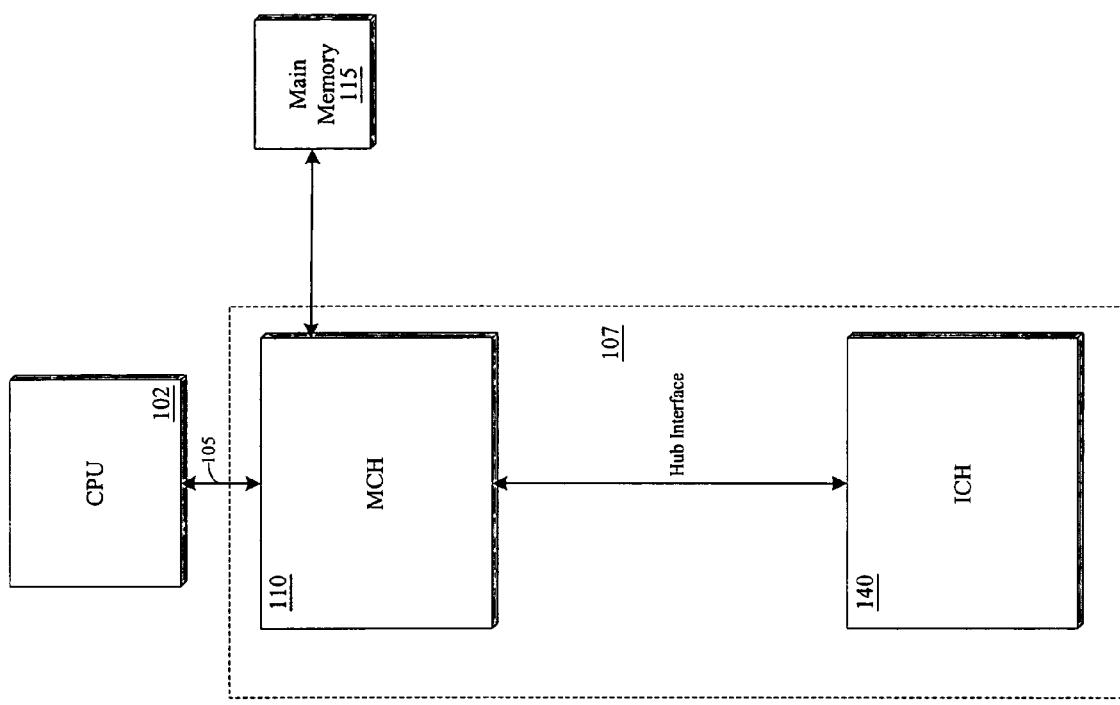
FIG. 1 illustrates one embodiment of a computer system.

FIG. 1 is a block diagram of one embodiment of a computer system 100. Computer system 100 includes a central processing unit (CPU) 102 coupled to bus 105. In one embodiment, CPU 102 is a processor in the Pentium® family of processors including the Pentium® II processor family, Pentium® III processors, and Pentium® IV processors available from Intel Corporation of Santa Clara, Calif. Alternatively, other CPUs may be used.

A chipset 107 is also coupled to bus 105. Chipset 107 includes a memory control hub (MCH) 110. MCH 110 is coupled to a main system memory 115. Main system memory 115 stores data and sequences of instructions and code represented by data signals that may be executed by CPU 102 or any other device included in system 100.

In one embodiment, main system memory 115 includes dynamic random access memory (DRAM); however, main system memory 115 may be implemented using other memory types. Additional devices may also be coupled to bus 105, such as multiple CPUs and/or multiple system memories.

In one embodiment, MCH 110 is coupled to an input/output control hub (ICH) 140 via a hub interface. ICH 140 provides an interface to input/output (I/O) devices within computer system 100. For instance, ICH 140 may be coupled to a Peripheral Array Interconnect bus adhering to a Specification Revision 2.1 bus developed by the PCI Special Interest Group of Portland, Oreg.

Figure 2:
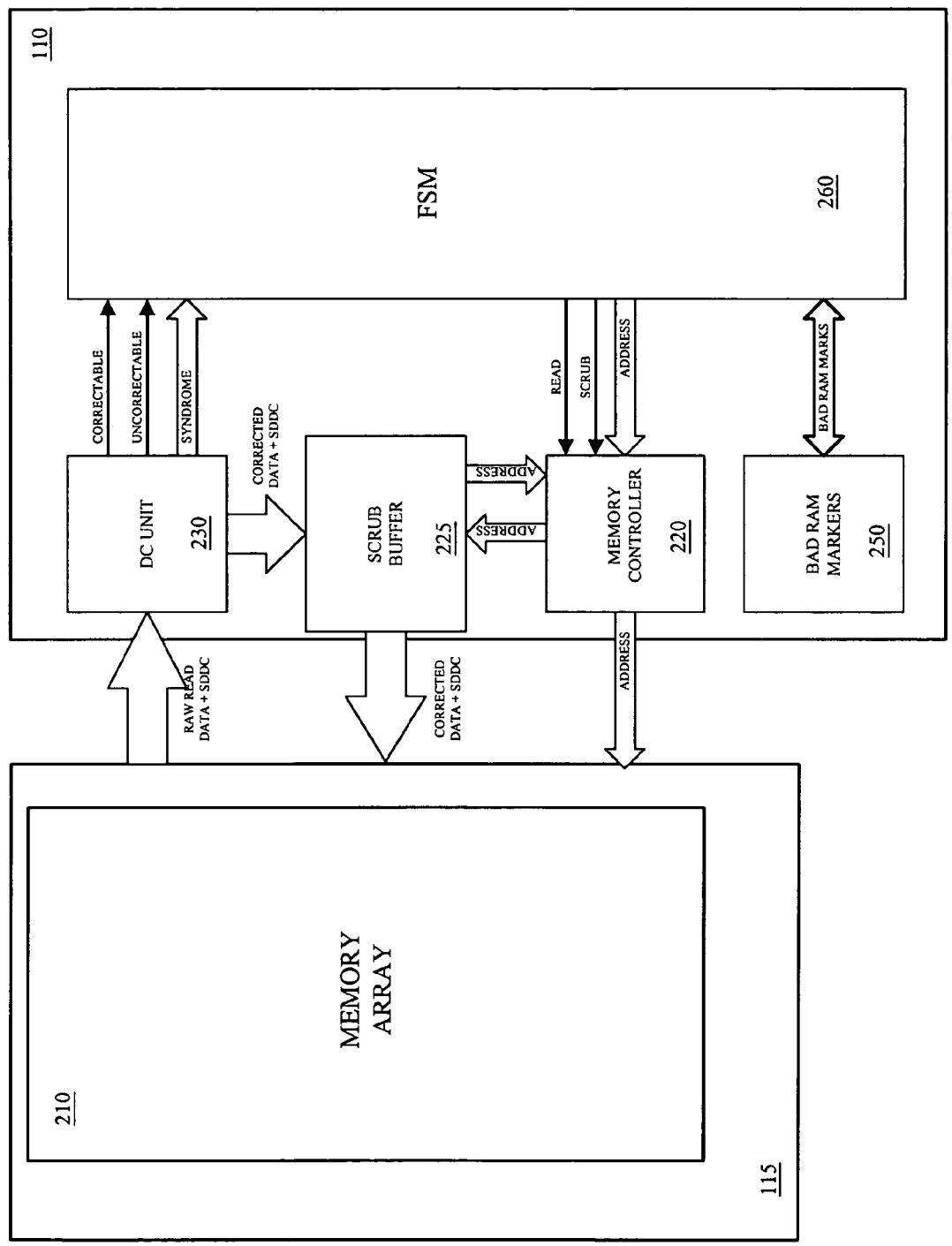
FIG. 2 illustrates one embodiment of a memory control hub.

FIG. 2 illustrates a block diagram of one embodiment of MCH 10 coupled to main memory 115. Memory 115 includes memory array 210. In one embodiment, memory array 210 includes an array of 18 rows. Each row is referred to as a rank. In a further embodiment, each rank has 8-bit (×8) RAMs. In yet a further embodiment, the RAMs are arranged on two Double Data RAM (DDR) channels.

MCH 110 includes memory controller 220, scrub buffer 225, detection/correction (DC) unit 230, bad RAM markers 250 and a control finite state machine (FSM) 260. Memory controller 220 controls accesses to memory array 210 by MCH 110. Scrub buffer 225 scrubs memory array 210. In one embodiment, scrub buffer 225 runs through a received set of addresses and searches for latent errors. Upon finding the latent errors, scrub buffer 225 corrects the errors. DC unit 230 detects single bit and double symbol errors, and corrects single symbol errors for each memory rank. In one embodiment, DC unit 230 implements a Single Device Disable Code (SDDC) for the ×8 RAMs within memory array 210, as will be described below.

Figure 3:
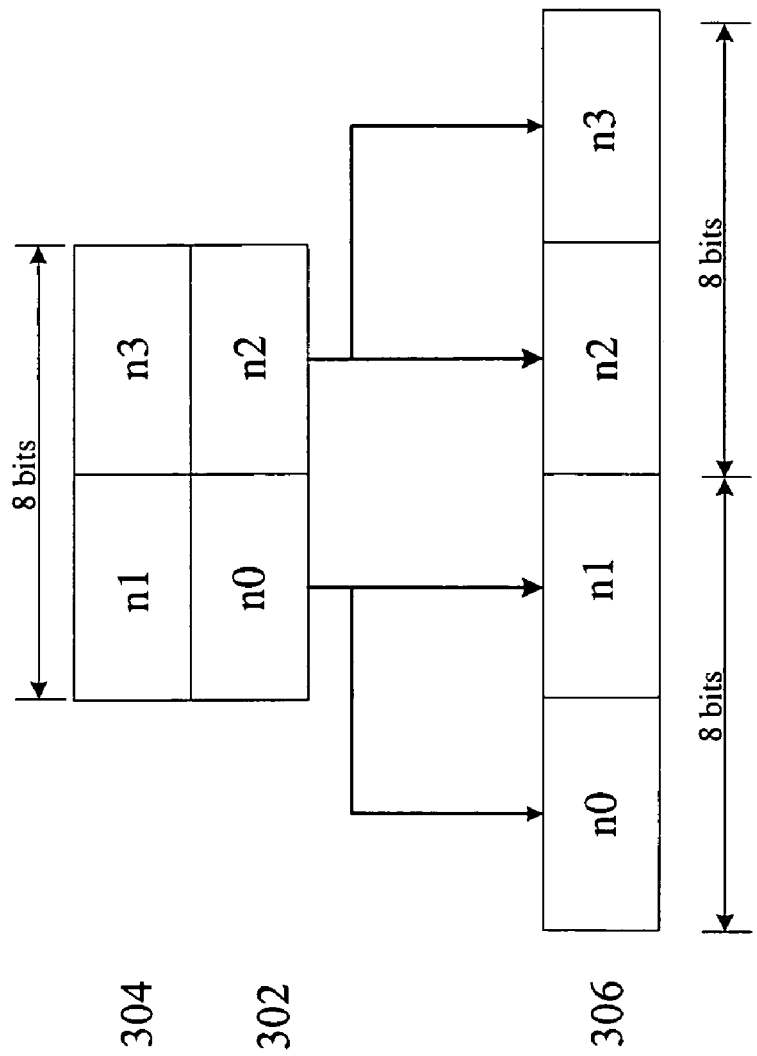
FIG. 3 illustrates one embodiment of a code word.

FIG. 3 illustrates one embodiment of a SDDC code word implemented by DC unit 230. An adjacent symbol codeword 306 to be formed from two clock phases of data 302 and 304 from a memory device is illustrated in FIG. 3. For example, in one embodiment, a memory access transaction comprises a transfer of 128 data bits plus an additional 16 ECC check bits per clock edge, for a total of 144 bits for each clock edge (288 bits for both clock edges).

In a first clock phase 302, a first nibble "n0" and a second nibble "n2" of data from a memory are transferred and mapped to a first nibble of each of two symbols of the codeword 306. Subsequently, during a second clock phase 304, a first nibble "n1" and a second nibble "n3" from a memory device are transferred and mapped to a second nibble of each of two symbols of the codeword 306. Thus, the two symbols of the codeword 306 are adjacent and are on a 16-bit boundary of the code word, which are designated as "adjacent symbols"; thus, the codeword 306 is an adjacent symbol codeword.

The illustrated scheme facilitates error detection and improves fault coverage of common mode errors. For example, for an ×4 memory device, there is a one to one mapping of nibbles from the ×4 memory device to a symbol in the underlying code word. In contrast, for a ×8 memory device, there is a one to one mapping of nibbles from half of the ×8 memory device to a symbol in the underlying code word.

Isolating common mode errors across nibbles to the symbol level is facilitated, resulting in increased fault coverage. Therefore, for the ×8 memory device, aliasing is precluded for a second device failure, except for rare instances. Likewise, device errors in the ×4 memory devices are isolated to a single symbol in the codeword 306; thus, there is complete double device coverage for the ×4 memory devices.

Figure 4:
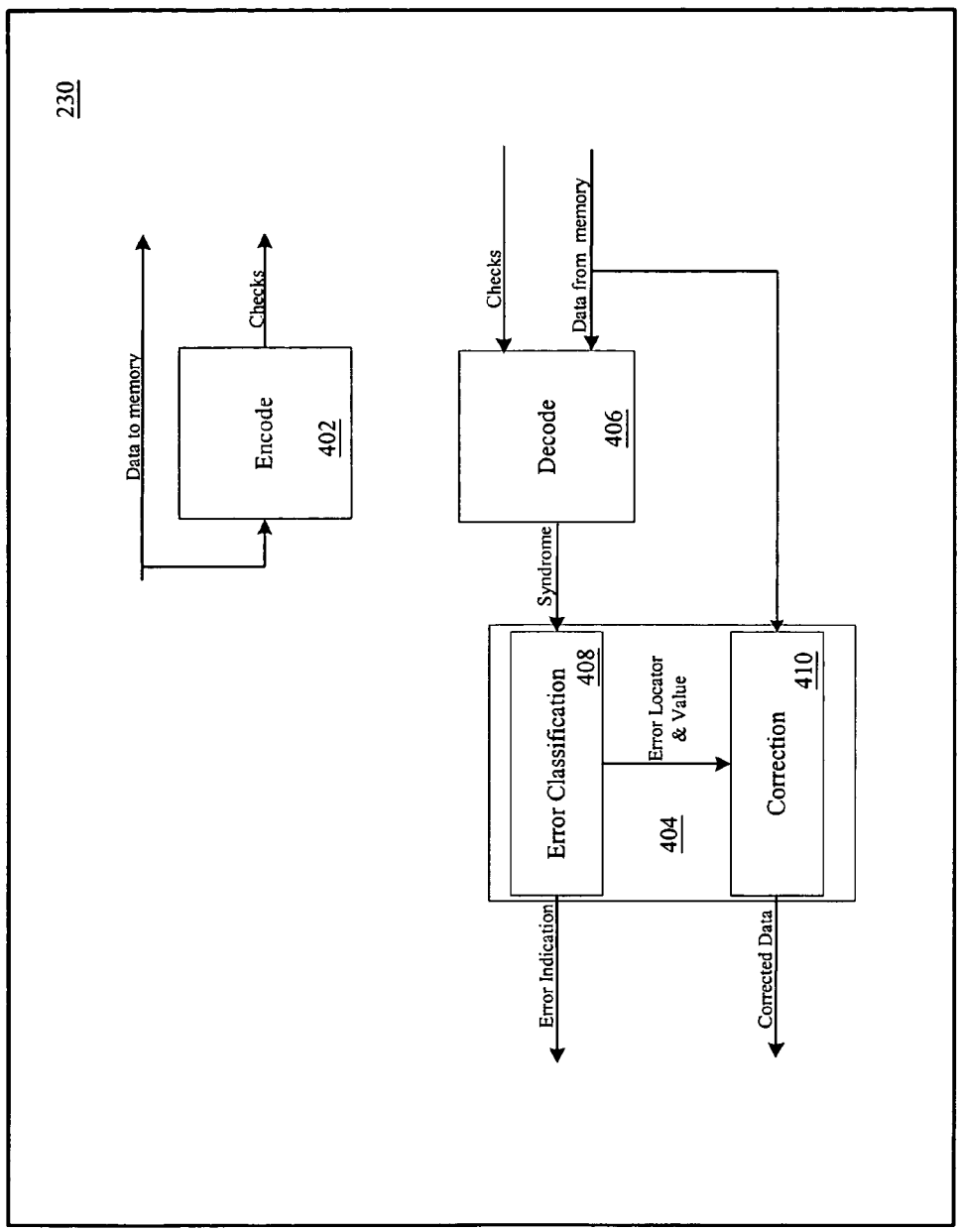
FIG. 4 illustrates one embodiment of a detection/correction unit.

FIG. 4 illustrates one embodiment of DC unit 230. In one embodiment, DC unit 230 generates a code word by creating check bits to be appended to data that is forwarded to memory. Subsequently, the DC unit 230 generates a syndrome based at least in part on decoding the code word received from memory and facilitates classifying errors and correcting the errors. In one embodiment, the code word from the memory device is an adjacent symbol codeword that was described in connection with FIG. 3.

DC unit 230 includes an encoder circuit 402, a decoder circuit 406, and an error classification and error correction unit 404. Error classification and error correction unit 404 includes an error classification circuit 408, and a correction circuit 410. Encoder circuit 402 receives data that is to be forwarded to memory devices within array 210. Encoder circuit 402 generates a plurality of check bits based at least in part on the data. Thus, a codeword is formed based at least in part on the plurality of check bits and the data and is forwarded to one or more memory devices.

In one embodiment, the check bits are generated from the binary form of a G-matrix, wherein the matrix has 32 rows and 256 columns to form 32 check bits. The check bits are computed as follows:

$c_i = \Sigma d_j \times G_{ij}$ for $i=0$ to 31 and $j=0$ to 255

For binary data, the multiply operation becomes an AND function and the sum operation the 1-bit sum or XOR operation. Thus, the resulting encoding circuit 402 includes 32 XOR, each tree computing one of the 32 check bits.

Subsequently, the one or more memory devices return data and the check bits back to decoder circuit 406. In one embodiment, decoder circuit 406 generates a 32-bit syndrome based at least in part on a 288-bit code word (as earlier described in connection with FIG. 3 for the 288-bit code word).

In one embodiment, the syndrome is generated from an H-matrix, wherein the matrix comprises 32 rows and 288 columns. Each syndrome bit is calculated as follows:

$s_i = \Sigma v_j \times H_{ij}$ for $i=0$ to 31 and $j=0$ to 287

As previously described with the encoder circuit, the generation of the syndrome bits is simplified to a XOR operation over the code word bits corresponding to the columns of the H-matrix that have a binary 1 value. Thus, decoder circuit 406 comprises 32 XOR trees, each tree computing one of the 32 syndrome bits. Therefore, in one embodiment, a 32-bit syndrome is generated by an H matrix receiving a 288-bit codeword. However, one of ordinary skill in the art will appreciate that the codeword is not limited to this bit configuration.

A method for detecting whether errors in data in a transaction with a memory device or devices includes generating check bits to be appended to data for forwarding to a memory device or devices. An adjacent symbol codeword is then generated based at least in part on data received from the memory device or devices to be utilized for checking the integrity of the data. Subsequently, a decoder generates a syndrome based at least in part on the adjacent symbol codeword. In the presence of an error as determined by the syndrome, an error classification and correction is performed.

Figure 5:
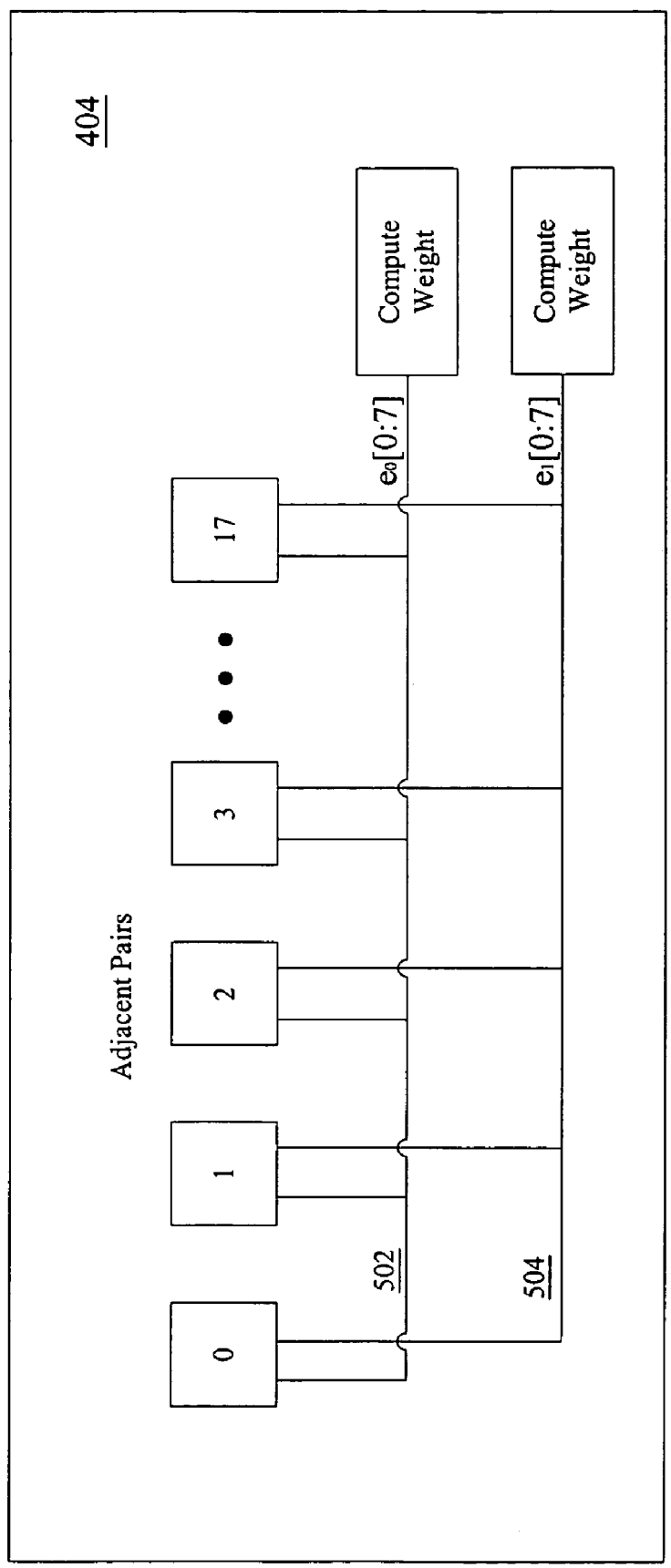
FIG. 5 illustrates one embodiment of a an error classification and correction unit.

FIG. 5 illustrates one embodiment of error classification and correction unit 404. Error classification circuit 408 is based at least in part on the decoding circuit's computation of the syndrome. For example, in one embodiment, if the syndrome (S)==0, then there is NO error. Otherwise, if the syndrome (S)>0, there is an error. Also, an error may be further classified by computing an error location vector L. For example, in one embodiment, the error is uncorrectable if L==0. Otherwise, the error is correctable in an indicated column if L>0. Furthermore, one may further classify the correctable error as whether the error occurs in a data column or check column. For example, if the error is in a check column, the data portion of the code word may bypass the correction logic.

In yet another embodiment, a single device correctable error may be classified based at least in part on a weight of the error value. As depicted in FIG. 5, an adjacent pair may generate error values $e_o$ and $e_l$. Thus, the error locator vector L is then used to gate the error values on a plurality of busses, 502 and 504 because the circuits allow for the error locator bits for one adjacent pair to be enabled for a given error pattern.

As discussed above, aliasing during error checking is typically an unlikely occurrence. However, there are instances where a single device in a memory rank has failed and a single bit failure in a second device occurs. In such an occurrence the combination could alias to a single device failure. Thus, in one embodiment, bad RAM markers 250 and FSM 260 are implemented to keep track of conditions that may result in aliasing.

Referring back to FIG. 2, bad RAM markers 250 keep track of errors within each memory rank. In one embodiment, if a memory rank has released two adjacent erroneous symbols, that symbol-pair (e.g., emitted by a single ×8 RAM device) is marked by bad RAM markers 250 as "bad". If the memory rank later indicates an error in some other device (a symptom of possible aliasing), that transfer is contained as a fatal error to mitigate the possibility of silent data corruption.

Figure 6:
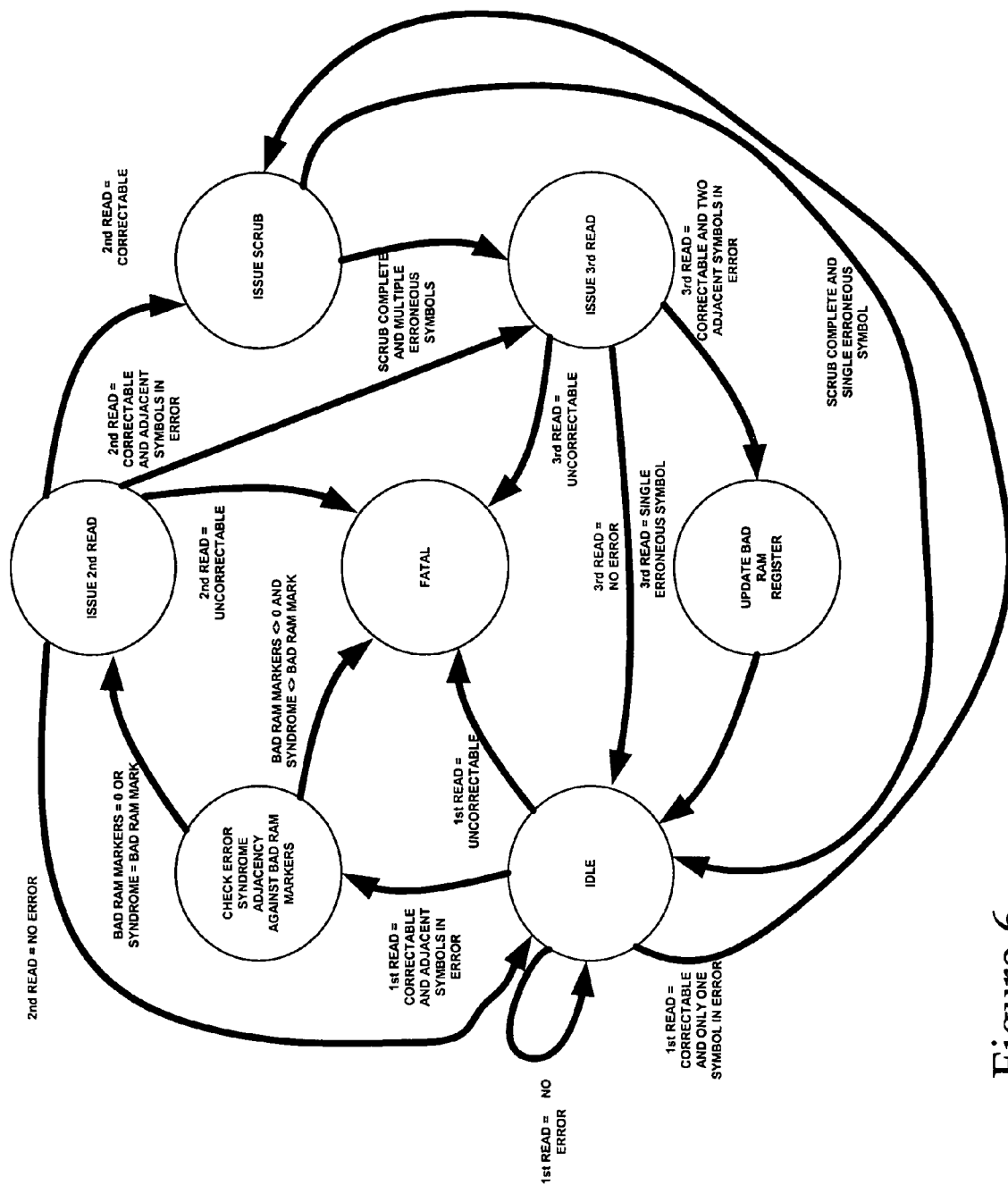
FIG. 6 illustrates one embodiment of a state stable.

FIG. 6 illustrates one embodiment of FSM 260. FSM 260 includes an IDLE, FATAL, CHECK ERROR, ISSUE $2^{ND}$ READ, ISSUE SCRUB, ISSUE $3^{RD}$ READ, and UPDATE states. Upon a request to read a memory device at memory 115, DC unit 230 begins error detection and signals to FSM 260 to begin operation. FSM 260 begins in the IDLE state. While in the IDLE state FSM 260 determines whether a read error has occurred. If an error has occurred, it is determined whether the error is correctable and whether only one symbol is in error. If so, control is forwarded to the ISSUE SCRUB state where the error is scrubbed. Subsequently, control is returned to the IDLE state.

However, if the error is correctable and adjacent symbols are in error, the CHECK state is entered. While in the CHECK state, FSM 260 checks bad ram markers 225 for the corresponding rank to determine if the rank includes a bad device. If bad RAM markers 225 are set, FSM 260 examines the error syndrome to determine whether the erroneous symbols appeared on the same device as indicated by bad ram markers 225. If the symbols appeared in a RAM other than those marked "bad", FSM 260 enters the FATAL state where the demand scrub is terminated in a fatal error. This occurs because the DC unit 230 has possibly invalidly corrected the data forwarded to the requestor.

If bad RAM markers 250 indicate that there are no bad devices in the rank, a transient error may have occurred. If a transient error has occurred or the bad RAM markers 250 indicate that the symbols appeared in the same device, a second read is issued. At the ISSUE $2^{ND}$ READ state, if the DC unit 230 signals to FSM 260 that the second read was uncorrectable, FSM 260 enters the FATAL state and the demand scrub is terminated in a fatal error.

If DC unit 230 signals to FSM 260 that the second read contains no error it indicates that the original error was transient, so that FSM 260 terminates the demand scrub and re-enters the IDLE state. If DC unit 230 signals to FSM 260 that the second read contained correctable errors, FSM 260 scrubs the errors (ISSUE SCRUB state) and writes the corrected data back to memory If FSM 260 determines that adjacent symbols in the second read were erroneous, FSM 260 immediately reads the same location from memory a third time. If DC unit 230 signals to the FSM that the data contained a correctable error and FSM 260 determines that adjacent symbols in the third read are in error, FSM 260 enters the UPDATE state and marks the device containing those symbols as "bad" in the bad ram markers 250 configuration registers. If DC unit 230 signals to FSM 260 that the third read contained an uncorrectable error, FSM 260 enters the FATAL state and terminates the scrub in a fatal error.

The above-described system supports the capability of distributing the codeword across 18×8 RAM's on 2 DDR channels. In addition, the possibility of aliasing is reduced by sequentially detecting a device failure and a single bit error.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A computer system comprising:
   a memory having two or more rows, each row including a plurality of memory devices; and
   a chipset, comprising:
      a detection/correction circuit to perform error detection correction on the memory upon the chipset receiving a read request for the memory by detecting single bit and double bit errors and correcting single bit errors for each memory row;
      markers to maintain a log of errors within each memory row; and
      a control state machine to track conditions that could result in aliasing caused by a failure of a first memory device and a single bit failure in a second memory device in a memory row within the memory.

2. The computer system of claim 1 wherein the control state machine to issue a scrub request upon detecting a correctable error at the memory.

3. The computer system of claim 2 wherein the chipset further comprises a scrub buffer to correct the correctable errors upon receiving the scrub command from the control state machine.

4. The computer system of claim 1 wherein the detection/correction unit comprises:
   an encoder circuit;
   a decoder circuit; and
   an error classification and correction unit.

5. The computer system of claim 4 wherein the encoder circuit receives data that is to be forwarded to memory devices and generates a codeword based upon data and a plurality of check bits.

6. The computer system of claim 4 wherein the check bits are generated from a binary form of a G-matrix, wherein the matrix has 32 rows and 256 columns to form 32 check bits.

7. The computer system of claim 5 wherein the decoder circuit receives the data and a plurality of check bits back from the memory devices and generates a syndrome.

8. The computer system of claim 7 wherein the syndrome is generated from an H-matrix, wherein the matrix comprises 32 rows and 288 columns.

9. A computer system comprising:
   a memory having two or more rows, each row including a plurality of memory devices; and
   a central processing unit (CPU) comprising:
      a detection/correction circuit to perform error detection correction on the memory upon the chipset receiving a read request for the memory by detecting single hit and double bit errors and correcting single bit errors for each memory row;
      markers to maintain a log of errors within each memory row; and
      a control state machine to track conditions that could result in aliasing caused by a failure of a first memory device and a single bit failure in a second memory device in a memory row within the memory.

10. The computer system of claim 9 wherein the control state machine to issue a scrub request upon detecting a correctable error at the memory.

11. The computer system of claim 10 wherein the CPU further comprises a scrub buffer to correct the correctable errors upon receiving the scrub command from the control state machine.

12. The computer system of claim 10 wherein the CPU further comprises a memory controller to control access to the memory.

13. The computer system of claim 9 wherein the detection/correction unit comprises:
   an encoder circuit;
   a decoder circuit; and
   an error classification and correction unit.

14. A chipset comprising:
   a detection/correction circuit to detect single bit and double bit errors and correct single bit errors for memory devices in each row of a memory array upon the chipset receiving a read request for a memory; and
   markers to maintain a log of errors within each memory row; and
   a control state machine to track conditions that could result in aliasing caused by a failure of a first memory device and a single bit failure in a second memory device in a memory row within the memory.

15. The chipset of claim 14 control slate machine to issue a scrub request upon detecting a correctable error at the memory.

16. The chipset of claim 14 further comprising a scrub buffer to correct the correctable errors upon receiving the scrub command from the control state machine.

17. The chipset of claim 14 further comprising a memory controller to control access to the memory.

18. The chipset of claim 14 wherein the detection/correction unit comprises:
- an encoder circuit;
- a decoder circuit; and
- an error classification and correction unit.

19. The computer system of claim 18 wherein the encoder circuit receives data that is to be forwarded to memory devices and generates a codeword based upon data and a plurality of check bits.

20. The computer system of claim 19 wherein the decoder circuit receives the data and a plurality of check bits back from the memory devices and generates a syndrome.

* * * * *

UNITED STATES PATENT AND TRADEMARK OFFICE
CERTIFICATE OF CORRECTION

PATENT NO. : 7,509,560 B2 Page 1 of 1
APPLICATION NO. : 10/747590
DATED : March 24, 2009
INVENTOR(S) : Alexander et al.

It is certified that error appears in the above-identified patent and that said Letters Patent is hereby corrected as shown below:

In column 5, at line 62 delete "slate" and insert --state--.

Signed and Sealed this

Twenty-seventh Day of July, 2010

David J. Kappos
*Director of the United States Patent and Trademark Office*